(12) United States Patent
Park

(10) Patent No.: US 10,319,446 B2
(45) Date of Patent: Jun. 11, 2019

(54) SEMICONDUCTOR MEMORY DEVICE

(71) Applicant: SK hynix Inc., Gyeonggi-do (KR)

(72) Inventor: Won Sun Park, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 354 days.

(21) Appl. No.: 15/398,229

(22) Filed: Jan. 4, 2017

(65) Prior Publication Data

US 2018/0012665 A1  Jan. 11, 2018

(30) Foreign Application Priority Data

Jul. 11, 2016  (KR) ........................ 10-2016-0087621

(51) Int. Cl.
| | |
|---|---|
| *G11C 7/10* | (2006.01) |
| *G11C 16/04* | (2006.01) |
| *G11C 16/08* | (2006.01) |
| *G11C 16/12* | (2006.01) |
| *G11C 16/32* | (2006.01) |
| *G11C 16/34* | (2006.01) |

(52) U.S. Cl.
CPC ............ *G11C 16/12* (2013.01); *G11C 7/1006* (2013.01); *G11C 16/0483* (2013.01); *G11C 16/08* (2013.01); *G11C 16/32* (2013.01); *G11C 16/3459* (2013.01)

(58) Field of Classification Search
CPC . G11C 16/0483; G11C 16/08; G11C 16/1006; G11C 16/12; G11C 16/30; G11C 16/32; G11C 2216/30
See application file for complete search history.

(56) References Cited

U.S. PATENT DOCUMENTS

| 5,410,680 A | * | 4/1995 | Challa ................... G06F 3/0601 703/24 |
| 8,953,383 B2 | * | 2/2015 | Yoo ..................... G11C 16/0483 365/185.2 |
| 10,096,369 B2 | * | 10/2018 | Murakami ............. G11C 16/14 |

FOREIGN PATENT DOCUMENTS

| JP | 6170596 B1 | * | 7/2017 | ............. G11C 16/14 |
| KR | 1020040041525 | | 5/2004 | |
| KR | 1020150141994 | | 12/2015 | |

* cited by examiner

*Primary Examiner* — Harry W Byrne
*Assistant Examiner* — R Lance Reidlinger
(74) *Attorney, Agent, or Firm* — IP & T Group LLP

(57) ABSTRACT

Provided herein is a semiconductor memory device. The semiconductor memory device includes: a memory cell array including a plurality of memory blocks; a voltage generation circuit configured to generate a plurality of operating voltages; a decoder circuit configured to transmit the plurality of operating voltages to the memory cell array in response to a serial data signal that is sequentially inputted; and a control logic configured to generate the data signal, internal address signals and an internal clock signal in response to a command.

20 Claims, 7 Drawing Sheets

SEMICONDUCTOR MEMORY DEVICE

CROSS-REFERENCE TO RELATED APPLICATION

The present application claims priority under 35 U.S.C. § 119(a) to Korean patent application no. 10-2016-0087621 filed on Jul. 11, 2016, which is incorporated herein by reference in its entirety.

BACKGROUND

1. Field

Various embodiments of the present disclosure relate to an electronic device, and more particularly, to a semiconductor memory device.

2. Description of Related Art

Semiconductor memory devices are memory devices realized using a semiconductor such as silicon (Si) germanium (Ge), gallium arsenide (GaAs), indium phosphide (InP), or the like. Semiconductor memory devices are classified into volatile memory devices and nonvolatile memory devices.

A volatile memory device is a memory device in which data stored therein is lost when power is turned off. Representative examples of the volatile memory device include a static RAM (SRAM), a dynamic RAM (DRAM), and a synchronous DRAM (SDRAM). A nonvolatile memory device is a memory device in which data stored therein is maintained even when power is turned off. Representative examples of the nonvolatile memory device include a read only memory (ROM), a programmable ROM (PROM), an electrically programmable ROM (EPROM an electrically erasable programmable ROM (EEPROM), a flash memory, a phase-change random access memory (PRAM), a magnetic RAM (MRAM), a resistive RAM (RRAM), and a ferroelectric RAM (FRAM). Flash memory is generally classified into a NOR type memory and a NAND type memory.

SUMMARY

Various embodiments of the present disclosure are directed to a semiconductor memory device which is capable of reducing the number of bits of signals outputted from a control logic during an operation thereof.

One embodiment of the present disclosure provides a semiconductor memory device including: a memory cell array including a plurality of memory blocks; a voltage generation circuit configured to generate a plurality of operating voltages; a decoder circuit configured to transmit the plurality of operating voltages to the memory cell array in response to a serial data signal that is sequentially inputted; and a control logic configured to generate the data signal, internal address signals and an internal clock signal in response to a command.

Another embodiment of the present disclosure provides a semiconductor memory device including: a control logic configured to generate parallel N-bit (N is a natural number) encoding signals according to an operation phase code, and to convert the N-bit encoding signals into a serial 1-bit data signal that is serially outputted; and a decoder circuit configured to restore the N-bit encoding signals from the 1-bit data signal, and then switch a plurality of operating voltages according to the restored N-bit encoding signals.

Another embodiment of the present disclosure provides a semiconductor memory device including, a memory cell array; a voltage generation circuit configured to generate a plurality of operating voltages; a control logic configured to generate parallel N-bit encoding signals and parallel-to-serial convert the N-bit encoding signals into a serial 1-bit data signal toggling N times to represent the N-bit encoding signals; and a decoder circuit configured to transfer one or more of the operating voltages to the memory cell array in response to the 1-bit data signal.

BRIEF DESCRIPTION OF THE DRAWINGS

Example embodiments will now be described more fully hereinafter with reference to the accompanying drawings in which.

DETAILED DESCRIPTION

Figure 1:
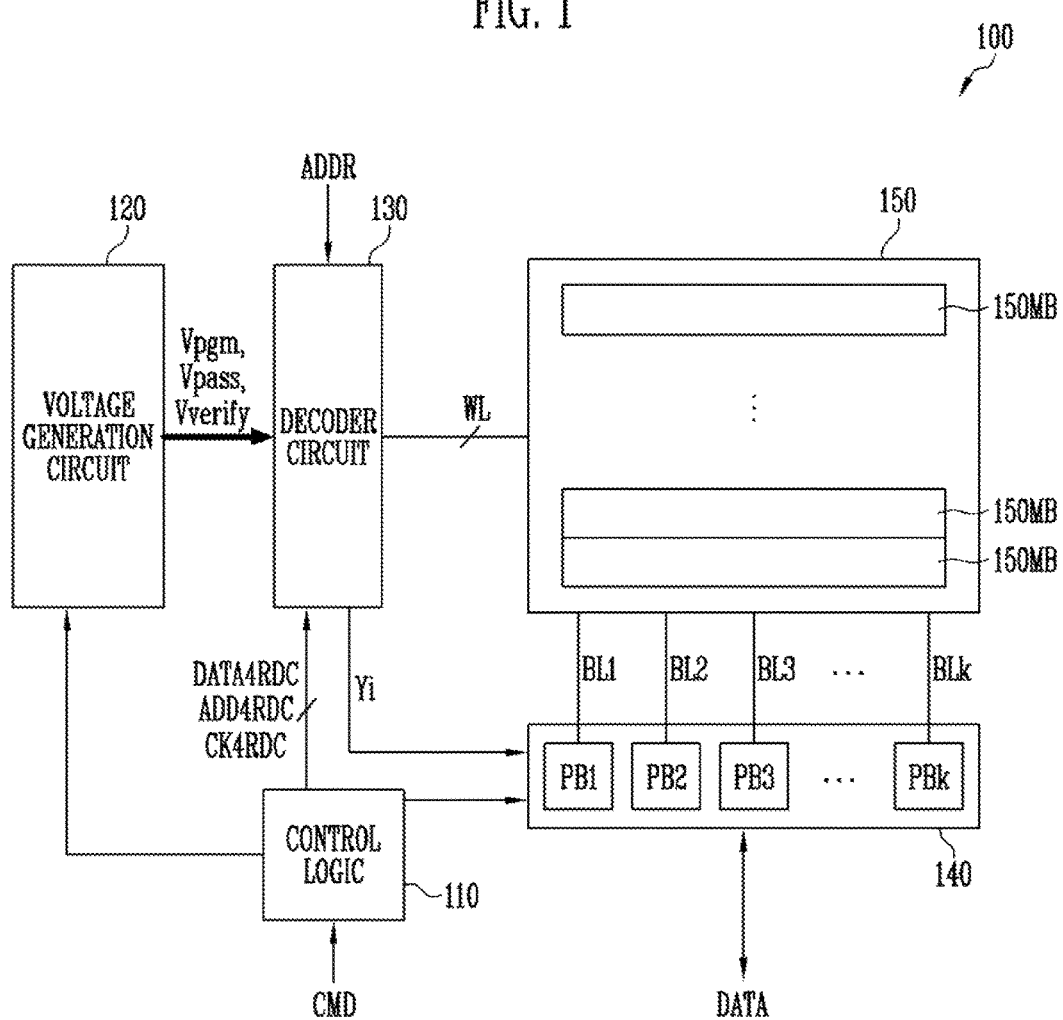
FIG. 1 is a block diagram illustrating a semiconductor memory device, according to an embodiment of the present disclosure.

Hereinafter, various embodiments of the present invention will be described in greater detail with reference to the accompanying drawings. However, we note that the present invention may be embodied in different other forms and should not be construed as limited to the embodiments set forth herein. Rather, these embodiments are provided so that this disclosure will be thorough and complete, and will fully convey the present invention to those skilled in the art to which the present invention pertains.

The drawings are simplified schematics of various embodiments and of intermediate structures and as such dimensions of various parts and regions may be exaggerated for clarity of illustration. Like reference numerals in the drawings denote like elements.

It will be understood that when an element is referred to as being "between" two elements, it can be the only element between the two elements, or one or more intervening elements may also be present. It will be further understood that when an element is referred to as being "connected to", or "coupled to" another element, it may be directly on, connected to, or coupled to the other element, or one or more intervening elements may be present.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure.

Furthermore, 'and/or' may include any one of or a combination of the components mentioned.

The terminology used herein is for the purpose of describing particular embodiments only and is not intended to be limiting of the present invention.

As used herein singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements.

Furthermore, unless defined otherwise, all the terms used in this specification including technical and scientific terms have the same meanings as would be generally understood by those skilled in the related art in view of the present disclosure.

The terms defined in generally used dictionaries should be construed as having the same meanings as would be construed iii the context of the present disclosure and the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly/connected/directly coupled" refers to one component directly coupling another component without an intermediate component.

In the following description, numerous specific details are set forth In order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a semiconductor memory device 100 according to an embodiment of the present disclosure.

Referring to FIG. 1, the semiconductor memory device 100 includes a control logic 110, a voltage generation circuit 120, a decoder circuit 130, a page buffer circuit 140, and a memory cell array 150.

The control logic 110 is coupled to the voltage generation circuit 120, the decoder circuit 130 and the page buffer circuit 140. The control logic 110 receives a command CMD through an input/output buffer (not shown) of the semiconductor memory device 100. The control logic 110 is configured to control the overall operation of the semiconductor memory device 100 in response to the command CMD.

In an embodiment of the present disclosure, the control logic 110 internally generates N-bit (N is a natural number) encoding signals in response to a command CMD, and converts the N-bit encoding signals to thus output a 1-bit data signal DATA4RDC, internal address signals ADD4RDC and an internal clock signal CK4RDC that are sequentially outputted Here, the total number of bits of the data signal DATA4RDC, the internal address signals ADD4RDC and the internal clock signal CK4RDC is less than "N". Therefore, the total number of wires coupling the control logic 110 to the decoder circuit 130 may equal the total number of bits of the data signal DATA4RDC, the internal address signals AA4RDC and the internal clock signal CK4RDC and, hence, may be less than "N".

Detailed configuration of the control logic 110 will be described later herein.

The voltage generation circuit 120 generates and outputs a plurality of operating voltages according to the control of the control logic 110. For example, during a program operation of the semiconductor memory device 100, the voltage generation circuit 120 generates and outputs a program voltage Vpgm, a pass voltage Vpass, a verify voltage Vverify according to the control of the control logic 110. In an example, during an operation of the semiconductor memory device 100, the voltage generation circuit 120 may generate and output sixteen operating voltages having different potential levels.

The decoder circuit 130 converts the data signal DATA4RDC, the internal address signals ADD4RDC and the internal clock signal CK4RDC from the control logic 110 into N-bit encoding signals. That is, the decoder circuit 130 restores the N-bit encoding signals based on the 1-bit data signal DATA4RDC provided from the control logic 110. The decoder circuit 130 decodes the N-bit encoding signals i.e., restored N-bit data signal, the internal address signals ADD4RDC and the internal clock signal CK4RDC and converts them into M-bit decoding signals wherein M is a natural number greater than N. Based on the M-bit decoding signals, the decoder circuit 130 selectively transfers a plurality of operating voltages from the voltage generation circuit 120 to a plurality of word lines. For example, in a program operation, a program voltage Vpgm may be applied to a selected global word line and a pass voltage Vpass may be applied to non-selected word lines. In addition, the decoder circuit 130 is coupled to the memory cell array 150 through a plurality of word lines WL. In response to an address ADDR received through the input/output buffer (not shown) in the semiconductor memory device 100, the decoder circuit 130 couples the selected global word line group to a plurality of word lines WL corresponding to a selected memory block among a plurality of memory blocks 150MB included in the memory cell array 150.

Detailed configuration of the control logic 130 will be described later herein.

The page buffer circuit 140 includes a plurality of page buffers PB1 to PBk. The plurality of page buffers PB1 to PBk are coupled to the memory cell array 150 through a plurality of bit lines BL1 to BLk. Each of the page buffers PB1 to PBk temporarily stores program data DATA inputted from the outside during the program operation, and controls a potential of a corresponding one of the bit lines BL1 to BLk in accordance with the temporarily stored program data DATA. The page buffer circuit 140 operates under the control of the control logic 110.

Furthermore, during a program verify operation, the page buffers PB1 to PBk perform a program verify operation for memory cells by sensing currents of the corresponding bit lines BL1 to BLk.

During a read operation, the page buffers PB1 to PBk read data stored in the memory cells by sensing currents of the corresponding bit lines BL1 to BLk.

The memory cell array 150 includes the plurality of memory blocks 150MB. The memory blocks 150MB are coupled to the decoder circuit 130 through the plurality of word lines WL. The memory blocks 150MB are coupled to the page buffer circuit 140 through the bit lines BL1 to BLk. Each of the memory blocks 150MB includes a plurality of memory cells. In an embodiment, the plurality of memory cells may be nonvolatile memory cells. Memory cells coupled to the same word line among the plurality of memory cells may be defined as one page. The memory cell array 150 may be configured with a plurality of pages.

In addition, each of the memory blocks 150MB of the memory cell array 150 includes a plurality of cell strings. Each of the cell strings includes a drain select transistor, the plurality of memory cells, and a source select transistor which are coupled in series between a bit line and a source line.

Detailed configuration of the plurality of memory blocks 150MB Will be described later herein.

In the semiconductor memory device 100 the control logic 110 converts parallel N-bit encoding signals into a serial 1-bit data signal DATA4RDC, and generates internal address signals ADD4RDC and an internal clock signal CK4RDC. The control logic 110 outputs the converted 1-bit data signal DATA4RDC, the internal address signals ADD4RDC and the internal clock signal CK4RDC to the decoder circuit 130 in order to control the decoder circuit 130. Due to this, even when the physical distance between the control logic 110 and the decoder circuit 130 is comparatively great, a circuit may be easily designed because the number (e.g., the number of 128) of N-bit encoding signals transferred from the control logic 110 to the decoder circuit 130 is reduced to the number (e.g., the number of 9) of the serial 1-bit data signal DATA4RDC, internal address signals ADD4RDC and internal clock signal CK4RDC, and the degree of integration may be improved by a reduction of the number of wires.

Figure 2:
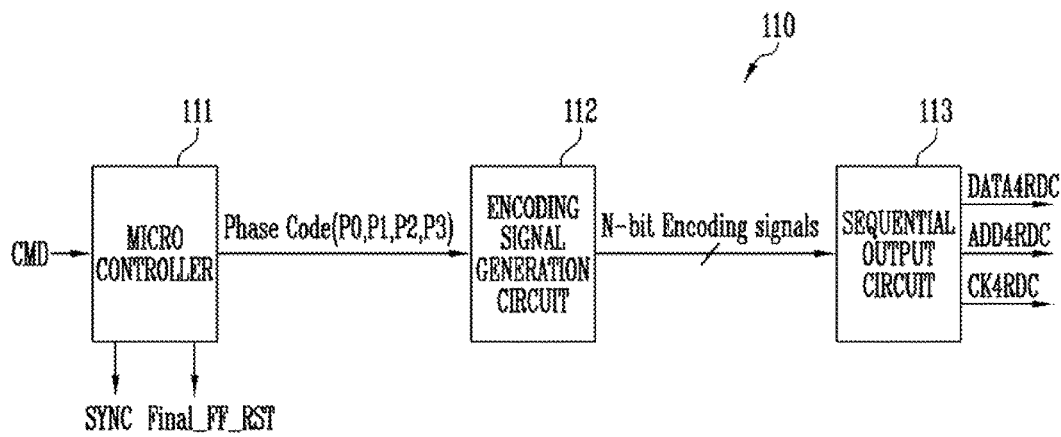
FIG. 2 is a block diagram illustrating an exemplary configuration of a control logic employed in the semiconductor memory device of FIG. 1.

FIG. 2 is a block diagram illustrating an exemplary configuration of the contra logic employed in the semiconductor memory device of FIG. 1.

Referring to FIG. 2, the control logic 110 includes a microcontroller 111, an encoding signal generation circuit 112 and a sequential output circuit 113.

The microcontroller selectively outputs a plurality of operation phase codes, for example four operation phase codes P0, P1, P2 and P3 depending on an operation phase in response to a command CMD that is inputted through the input/output buffer (not shown) from the outside.

The microcontroller 111 may store a plurality of algorithms for the overall operations of the semiconductor memory device 100, and may sequentially output the plurality of operation phase codes P0, P1, P2 and P3 according to a selected algorithm among the plurality of algorithms in response to a command CMD. The microcontroller 111 may include a storage (not shown) in which the plurality of algorithms for the overall operations of the semiconductor memory device 100 are stored.

In addition, the microcontroller 111 may output a synchronization signal SYNC toggling once at each start of all the operation phases represented by the operation phase codes P1, P2 and P3 except for the first operation phase represented by the operation phase code P0 among the plurality of operation phase codes P0, P1, P2 and P3. The microcontroller 111 may also output a reset signal Final_F-F_RST toggling once at the start of the first operation phase represented by the first operation phase code P0, in which a selected global word line is set to the ground voltage GND and once when the operation represented by all the operation phase codes P1 P2 and P3 except for the first operation phase code P0 is completed.

The encoding signal generation circuit 112 generates and outputs N-bit encoding signals in response to the respective operation phase codes P0, P1, P2 and P3. For example, the N-bit encoding signals may be 128-bit signals. The number (i.e., "N") of bits of the encoding signals may be increased in proportion to the number of operating voltages that are generated In the voltage generation circuit 120 and the number of global word line groups.

The sequential output circuit 113 parallel-to-serial converts the parallel N-bit encoding signals into the serial 1-bit data signal DATA4RDC, and generates the internal address signals ADD4RDC and the internal clock signal CK4RDC for the 1-bit data signal DATA4RDC. The sequential output circuit 113 outputs the 1-bit data signal DATA4RDC the internal address signals ADD4RDC and the internal clock signal CK4RDC in a parallel way. The data signal DATA4RDC toggles N times to represent the respective N-bit encoding signals. The internal address signals ADD4RDC also toggles N times to designate storage location of the: respective N toggles of the data signal DATA4RDC in a prefetch register 131 of the decoder circuit 130, which will be described later. The internal clock signal CK4RDC also toggles N times to synchronize the data signal DATA4RDC and the internal address signals ADD4RDC.

For example, when the N-bit encoding signals are 128-bit signals (i.e., the number of "N" is 128), each of the parallel 128-bit encoding signals is converted into 128 a serial 1-bit data signal DATA4RDC while 7-bit internal address signals ADD4RDC and a 1-bit internal dock signal CK4RDC are generated for the serial 1-bit data signal DATA4RDC. The serial 1-bit data signal DATA4RDC toggles 128 times to represent the respective 128-bit encoding signals, the 7-bit internal address signals ADD4RDC also toggle 128 times to designate the storage location of the respective 128 toggles of the serial 1-bit data signal DATA4RDC in the prefetch register 131 of the decoder circuit 130, and the 1-bit internal clock signal CK4RDC also toggles 128 times to synchronize the toggles of the serial 1-bit data signal DATA4RDC and the 7-bit internal address signals ADD4RDC. If the number of bits of the N-bit encoding signals is increased, the number of the internal address signals ADD4RDC may also be increased as many in order to designate storage location of the respective N toggles of the data signal DATA4RDC in the prefetch register 131 of the decoder circuit 130.

As described above, the control logic 110 parallel-to-serial converts each of the N-bit encoding signals into a 1-bit data signal DATA4RDC while generating the multi-bit internal address signals ADD4RDC and 1-bit internal clock signal CK4RDC. Therefore, the number of wires for transmitting the signals to the decoder circuit 130 of FIG. 1 may be reduced from the number of N (e.g., the number of 128)

to the number (e.g., the number of 9) of the 1-bit data signal DATA4RDC, the 7-bit internal address signals ADD4RDC and 1-bit internal dock signal CK4RDC.

Figure 3:
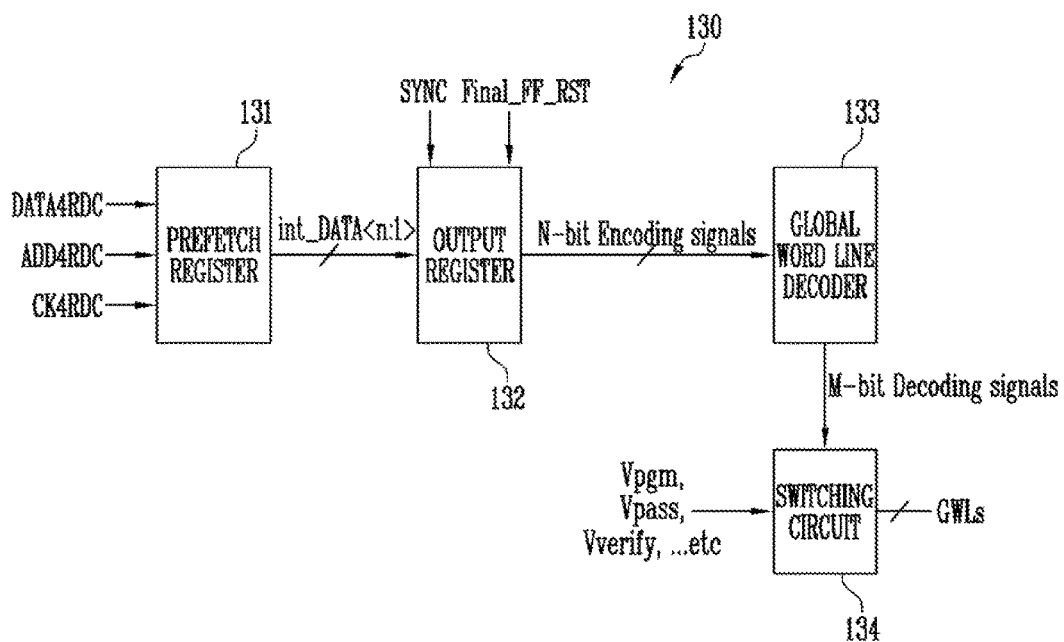
FIG. 3 is a block diagram illustrating an exemplary configuration of a decoder circuit employed in the semiconductor memory device of FIG. 1

FIG. 3 is a block diagram illustrating an exemplary configuration of the decoder circuit employed in the semiconductor memory device of FIG. 1.

Referring to FIG. 3, the decoder circuit 130 includes a prefetch register 131, an output register 132, a global word line decoder 133 and a switching circuit 134.

The prefetch register 131 stores the data signal DATA4RDC toggling N times to represent the N-bit encoding signals according to the multi-bit internal address signals ADD4RDC and the internal clock signal CK4RDC, and then outputs the stored N numbers of the 1-bit data signal DATA4RDC in parallel as internal data signals int_DATA<n:1>.

The output register 132 transfers from the prefetch register 131 to the global word line decoder 133 the parallel internal data signals int_DATA<n:1> as restored N-bit encoding signals in response to the synchronization signal SYNC, and resets the N-bit encoding signals in response to the reset signal Final_FF_RST.

The output register 132 outputs N-bit encoding signals reset to an initial level in response to the reset signal Final_FF_RST. When all of the N-bit encoding signals are initialized to a logic low level, all of the global word line groups GWLs may be set to the ground voltage GND level.

The output register 132 transfers the parallel internal data signals int_DATA<n:1> as the restored N-bit encoding signals from the prefetch register 131 to the global word line decoder 133 in response to the synchronization signal SYNC. That is, the output register 132 restores the N-bit encoding signals from the plurality of the internal data signals int_DATA<n:1>.

The global word line decoder 133 decodes the restored N-bit encoding signals into M-bit (M is a natural number greater than N) decoding signals.

In response to the M-bit decoding signals, the switching circuit 134 selectively transfers the operating voltages (for example, Vpgm, Vpass, Vverify, etc) from the voltage generation circuit 120 to a plurality of the global word line groups GWLs, and electrically couples a selected global word line group among the plurality of the global word line groups GWLs to word lines of the memory cell array.

In the case where the N-bit encoding signals are reset to the initial level, the switching circuit 134 applies the ground voltage GND to the selected global word line group.

Figure 4:
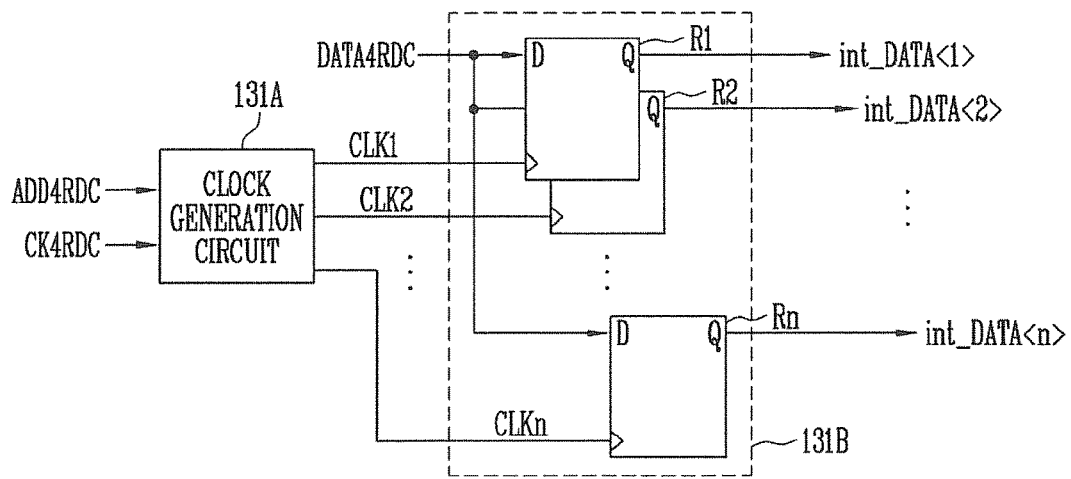
FIG. 4 is a circuit diagram illustrating an exemplary configuration of a prefetch register employed in the decoder circuit of FIG. 3.

FIG. 4 is a circuit diagram illustrating an exemplary configuration of the preach register 131.

Referring to FIG. 4, the prefetch register 131 includes a clock generation circuit 131A and a register circuit 131B.

The clock generation circuit 131A generates the first to $n_{th}$ clock signals CLK1 to CLKn, the number of which correspond to the number of N-bit encoding signals, in response to the internal address signals ADD4RDC and the internal clock signal CK4RDC. That is, the clock generation circuit 131A generates the respective first to $n_{th}$ clock signals CLK1 to CLKn in response to the internal address signals ADD4RDC that indicate addresses of the N numbers of the 1-bit data sign& DATA4RDC in the register circuit 131B, As described above, the 1-bit data signal DATA4RDC toggles N times and thus the N numbers of the 1-bit data signal DATA4RDC represent the N-bit encoding signals. The internal address signals ADD4RDC also toggles N times to designate storage location of the respective N toggles of the data signal DATA4RDC in the register circuit 1313 of the prefetch register 131. The internal clock signal CK4RDC also toggles N times to synchronize the data signal DATA4RDC and the internal address signals ADD4RDC. Therefore, whenever the 1-bit data signal DATA4RDC toggles, the internal address signals ADD4RDC indicates the storage location of the current toggle of the 1-bit data signal DATA4RDC. Here, the clock generation circuit 131A may generate the first to $n_{th}$ dock signals CLK1 to CLKn such that the first to $n_{th}$ clock signals CLK1 to CLKn sequentially toggle in response to the internal address signals ADD4RDC and the internal clock signal CK4RDC. It is preferable that the first to $n_{th}$ clock signals CLK1 to CLKn toggle at different timings.

The register circuit 1313 stores the data signals DATA4RDC in response to the first to $n_{th}$ clock signals CLK1 to CLKn and then outputs in parallel the stored data as an "N" number of internal data int_DATA<1> to int_DATA<n>

The register circuit 1318 may include an "N" number of registers R1 to Rn. Here, each of the "N" number of registers R1 to Rn may be formed of a D (delay) flip-flop. The "N" number of registers RI to Rn receive in common the data signal DATA4RDC through an input terminal, and each of the registers R1 to Rn receives one of the first to $n_{th}$ clock signals CLK1 to CLKn as a synchronization signal. That is, each of the "N" number of registers R1 to Rn stores the 1-bit data signal DATA4RDC, which toggles n times in synchronization with the first to $n_{th}$ clock signals CLK1 to CLKn and is inputted into a corresponding one among the "N" number of registers R1 to Rn when the corresponding one among the first to $n_{th}$ clock signals CLK1 to CLKn toggles, and then outputs the stored 1-bit data signal DATA4RDC as a corresponding one of the internal data int_DATA<1> to int_DATA<n>. In other words, in an example where N is 128, each 1-bit of a 128 serial data signal DATA4RDC is stored in a corresponding register among the 128 registers R1 to Rn, where for example the first 1-bit is stored in register R1, the second 1-bit is stored in register R2 and so on and so forth the last $128^{th}$ 1-bit of the serial data signal DATA4RDC is stored in the $n^{th}$ register Rn wherein n equals N, n equals 128.

Figure 5:
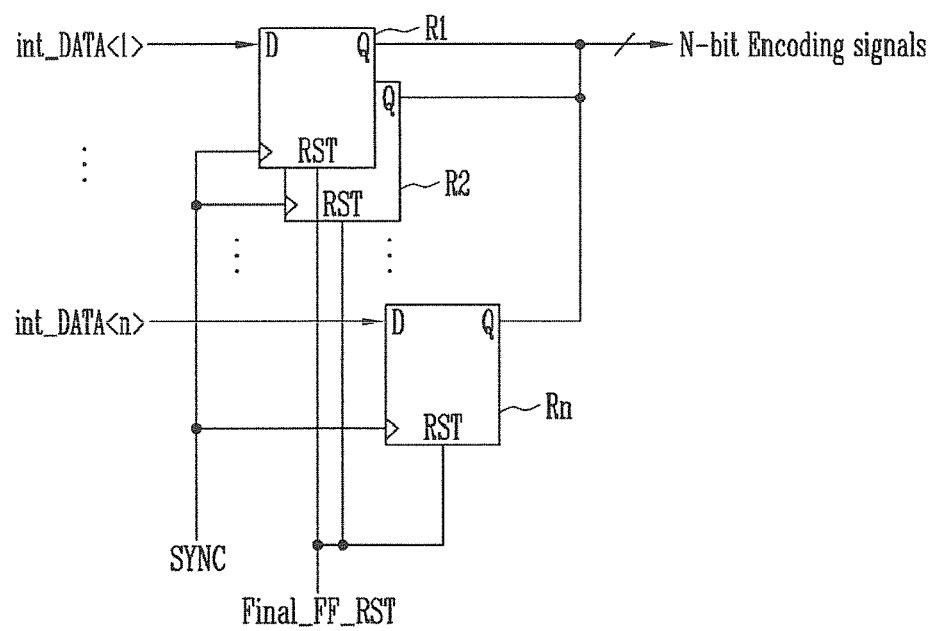
FIG. 5 is a circuit diagram illustrating an exemplary configuration of an output register employed in the decoder circuit of FIG. 3.

FIG. 5 is a circuit diagram illustrating an exemplary configuration of the output register 132.

Referring to FIG. 5, the output register 132 transfers from the prefetch register 131 to the global word line decoder 133 the parallel internal data signals int_DATA<n:1> as the restored N-bit encoding signals in response to the synchronization signal SYNC, and reset the N-bit encoding signals in response to the reset signal Final_FF_RST.

The output register 132 may include an "N" number of registers R1 to Rn, the number of which correspond to the number of N-bit encoding signals, Here, each of the "N" number of registers R1 to Rn may be formed of a D (delay) flip-flop.

The "N" number of registers RI to Rn output the N-bit encoding signals reset to the initial level in response to the reset signal Final_FF_RST outputted from the microcontroller 111.

Each of the "N" number of registers R1 to Rn receives and stores a corresponding one of the internal data int_DATA<n:1> in response to the synchronization signal SYNC outputted from the microcontroller 111, and outputs the stored internal data int_DATA<N:1> as corresponding one of the restored N-bit encoding signals.

Figure 6:
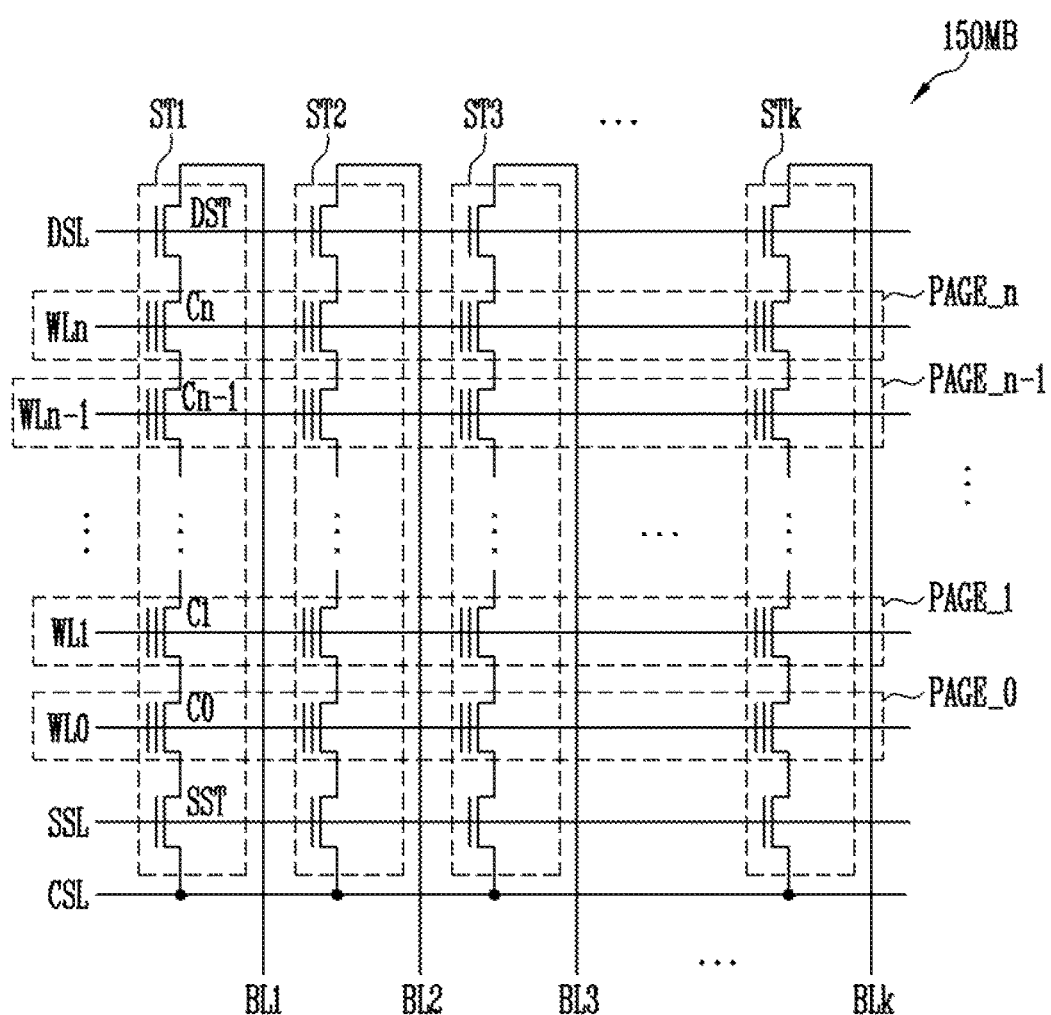
FIG. 6 is a circuit diagram illustrating an exemplary configuration of any one of the memory blocks of FIG. 1.

FIG. 6 is a circuit diagram illustrating an exemplary configuration of any one of the memory blocks of FIG. 1.

The memory blocks of FIG. 1 may have the same configuration; therefore, any one of the memory blocks will be described as an example.

Referring to FIG. 6, the memory block 150MB includes a plurality of cell strings ST1 to STk which are coupled between a plurality of an equal number of corresponding bit lines BL1 to BLk and a common source line CSL. For example, a first bit line BL1 is coupled to a first cell string ST1 a second bit line BL2 is coupled to a second cell string ST2 and so on and so forth with the last bit line BLk being coupled to the last cell string STk. The common source line CSL is coupled in common to the plurality of memory strings ST1 to STk.

Since the cell strings ST1 to STk have almost the same configuration, only the first cell string ST1 will be described herein as an example.

The first cell string ST1 may include a source select transistor SST, a plurality of memory cells C0 to Cn, and a drain select transistor DST which are coupled in series to each other in the recited order between the common source line CSL and the first bit line BL1. Gates of the source select transistors SST coupled to the different cell strings ST1 to STm are coupled to the source select line SSL. Gates of the memory cells C0 to Cn are respectively coupled to the word lines WL0 to WLn. Gates of the drain select transistors DST are coupled to the drain select line DSL.

A plurality of memory cells coupled to the same word line may form a page, for example, the memory block 150MB may include a plurality of pages PAGE_0 to PAGE_n, corresponding to word lines WL0 to WLn.

Figure 7:
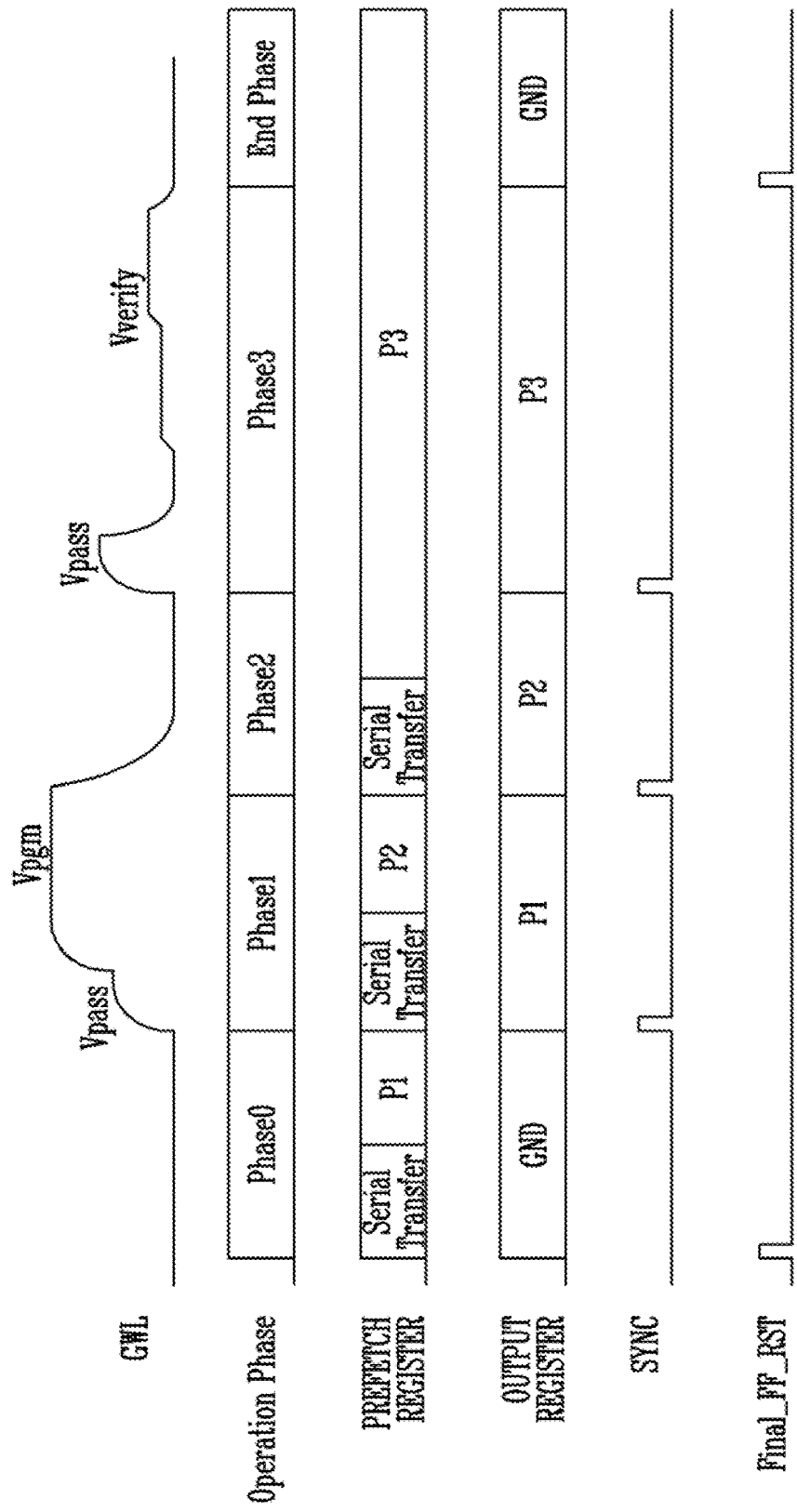
FIG. 7 is a waveform diagram of signals to illustrate an operation of the semiconductor memory device of FIG. 1, according to an embodiment of the present disclosure.

FIG. 7 is a waveform diagram of signals illustrating an operation of the semiconductor memory device 100 according to an embodiment of the present disclosure.

A program operation of the semiconductor memory device 100 will be described as an example with reference to FIGS. 1 to 7.

When a command CMD corresponding to a program operation is inputted from the outside, the microcontroller 111 of the control logic 110 selectively outputs a plurality of operation phase codes P0, P1, P2 and P3 according to a number of sub-operations forming the program operation.

It is exemplarily assumed that a sub-operation corresponding to a first phase Phase0, which is represented by the first operation phase code P0, is an operation of applying the ground voltage GND to the global word line groups GWLs. The microcontroller 111 outputs a reset signal Final_FF_RST and the output register 132 of the decoder circuit 130 outputs the N-bit encoding signals reset to the initial level in response to the reset signal Final_FF_RST. The global word line decoder 133 outputs M-bit decoding signals representing the N-bit encoding signals reset to the initial level. The switching circuit 134 applies the ground voltage GND to the global word line groups GWLs in response to the M-bit decoding signals.

The microcontroller 111 outputs the operation phase code P1 corresponding to a second phase Phase1 before the start of the second phase Phase1 (i.e., during a period of the first phase Phase0). Thereby, the encoding signal generation circuit 112 generates and outputs the N-bit encoding signals corresponding to the operation phase code P1, and the sequential output circuit 113 parallel-to-serial converts the N-bit encoding signals into the 1-bit data signal DATA4RDC, and generates the internal address signals ADD4RDC and the internal clock signal CK4RDC for the 1-bit data signal DATA4RDC.

The prefetch register 131 of the decoder circuit 130 converts the data signals DATA4RDC corresponding to the operation phase code P1 into the parallel internal data signals int_DATA<n:1> according to the multi-bit internal address signals ADD4RDC and the internal clock signal CK4RDC.

When the operation phase becomes the second phase Phase1, the output register 132 of the decoder circuit 130 transfers the parallel internal data signals int_DATA<n:1> as the restored N-bit encoding signals corresponding to the operation phase code P1 from the prefetch register 131 to the global word line decoder 133 in response to the synchronization signal SYNC.

The global word line decoder 133 decodes the restored N-bit encoding signals into the M-bit decoding signals.

In response to the M-bit decoding signals, the switching circuit 134 transfers a pass voltage Vpass among the operating voltages from the voltage generation circuit 120 to a selected global word line group GWL for a predetermined time, and then transfers a program voltage Vpgm to the selected global word line group GWL.

The microcontroller 111 outputs the operation phase code P2 corresponding to a third phase Phase2 before the start of the third phase Phase2 (i.e., during a period of the second phase Phase1). Thereby, the encoding signal generation circuit 112 generates and outputs the N-bit encoding signals corresponding to the operation phase code P2, and the sequential output circuit 113 parallel-to-serial converts the N-bit encoding signals into the 1-bit data signal DATA4RDC, and generates the internal address signals ADD4RDC and the internal clock signal CK4RDC for the 1-bit data signal DATA4RDC.

The prefetch register 131 of the decoder circuit 130 converts the data signals DATA4RDC corresponding to the operation phase code P2 into the parallel internal data signals intDATA<n:1> according to the multi-bit internal address signals ADD4RDC and the internal dock signal CK4RDC.

When the operation phase becomes the third phase Phase2, the output register 132 of the decoder circuit 130 transfers the parallel internal data signals int_DATA<n:1> as the restored N-bit encoding signals corresponding to the operation phase code P2 from the prefetch register 131 to the global word line decoder 133 in response to the synchronization signal SYNC.

The global word line decoder 133 decodes the restored N-bit encoding signals into the M-bit decoding signals.

In response to the M-bit decoding signals the switching circuit 134 discharges the potential level of the selected global word line group GWL to the ground voltage level.

The microcontroller 111 outputs the operation phase code P3 corresponding to a fourth phase Phase3 before the start of the fourth phase Phase3 (i.e., during a period of the third phase Phase2). Thereby, the encoding signal generation circuit 112 generates and outputs the N-bit encoding signals corresponding to the operation phase code P3, and the sequential output circuit 113 parallel-to-serial converts the N-bit encoding signals into the 1-bit data signal DATA4RDC, and generates the internal address signals ADD4RDC and the internal dock signal CK4RDC for the 1-bit data signal DATA4RDC.

The prefetch register 131 of the decoder circuit 130 converts the data signals DATA4RDC corresponding to the operation phase code P3 into the parallel internal data signals int_DATA<n:1> according to the multi-bit internal address signals ADD4RDC and the internal clock signal CK4RDC.

When the operation phase becomes the fourth phase Phase3, the output register 132 of the decoder circuit 130 transfers the parallel internal data signals int_DATA<n:1> as the restored N-bit encoding signals corresponding to the operation phase code P3 from the prefetch register 131 to the global word line decoder 133 in response to the synchronization signal SYNC.

The global word line decoder 133 decodes the restored N-bit encoding signals into the M-bit decoding signals.

In response to the Mbit decoding signals, the switching circuit 134 transfers a pass voltage Vpass among the operating voltages from the voltage generation circuit 120 to the selected global word line group GWL for a predetermined time, and then transfers a verify voltage Vverify to the selected global word line group GWL.

Thereafter, when the operation phase enters an end phase, the microcontroller 111 outputs a reset signal Final_FF_RST and the output register 132 of the decoder circuit 130 outputs the N-bit encoding signals reset to the initial level in response to the reset signal Final_FF_RST. The global word line decoder 133 outputs M-bit decoding signals representing the N-bit encoding signals reset to the initial level. The switching circuit 134 applies the ground voltage GND to the global word line groups GWLs in response to the M-bit decoding signals.

As described above, according to the embodiment of the present disclosure, the control logic 110 may substitute the data signal DATA4RDC, the internal address signals ADD4RDC, the internal clock signal CK4RDC, the synchronization signal SYNC and the reset signal Final_FF_RST for the N-bit encoding signals, which are outputted to control the decoder circuit 130. Therefore, the number of wires for transmitting the N-bit encoding signals to the decoder circuit 130 may be significantly reduced.

Figure 8:
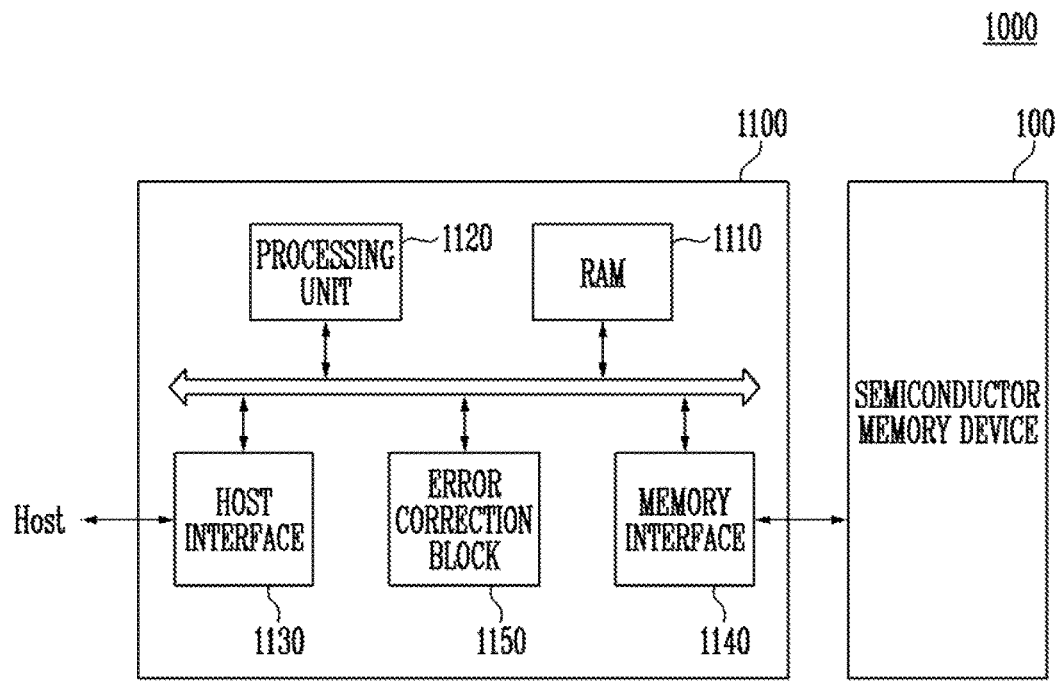
FIG. 8 is a block diagram showing a memory system including the semiconductor memory device of FIG. 1 according to an embodiment of the present disclosure.

FIG. 8 is a block diagram showing a memory system 1000 including the semiconductor memory device 100 of FIG. 1, according to an embodiment of the present disclosure.

Referring to FIG. 8 the semiconductor memory device 100 is operatively coupled to a controller 1100 which controls the communications between the semiconductor memory device 100 and a host.

The semiconductor memory device 100 may have the same configuration and operation as those of the semiconductor memory device described with reference to FIG. 1. Therefore, hereinafter, repetitive explanations will be omitted.

The controller 1100 is coupled to the host and the semiconductor memory device 100. The controller 1100 is configured to access the semiconductor memory device 100 in response to a request from the host Host For example the controller 1100 is configured to control read, write, erase, and background operations of the semiconductor memory device 100. The controller 1100 is configured to provide an interface between the host Host and the semiconductor memory device 100. The controller 1100 is configured to drive firmware for controlling the semiconductor memory device 100.

The controller 1100 includes a RAM Random Access Memory) 1110, a processing unit 1120, a host interface 1130, a memory interface 1140, and an error correction block 1150. The RAM 1110 is used as at least one of operation memory of the processing unit 1120, a cache memory between the semiconductor memory device 100 and the host Host, and a buffer memory between the semiconductor memory device 100 and the host Host. The processing unit 1120 controls the operation of the controller 1100. In addition, the controller 1100 may temporarily store program data provided from the host Host during the write operation.

The host interface 1130 includes a protocol for performing data exchange between the host Host and the controller 1100, For example, the controller 1100 is configured to communicate with the host Host through at least one of various interface protocols such as a universal serial bus (USB) protocol, a multimedia card (MMC) protocol, peripheral component interconnection (PCI) protocol a PCI-express (PCI-E) protocol, an advanced technology attachment (ATA) protocol, a serial-ATA protocol, a parallel-ATA protocol, a small computer small interface (SCSI) protocol an enhanced small disk interface (ESDI) protocol, and an integrated drive electronics (IDE) protocol a private protocol, and the like.

The memory interface 1140 interfaces, with the semiconductor memory device 100. For example, the memory interface may include a NAND interface or NOR interface.

The error correction block 1150 uses an error correcting code (ECC) to detect and correct an error in data received from the semiconductor memory device 100. The processing unit 1120 may adjust the read voltage according to an error detection result from the error correction block 1150, and control the semiconductor memory device 100 to perform re-reading. In an exemplary embodiment, the error correction block may be provided as an element of the controller 1100. Any suitable error correcting code may be employed.

The controller 1100 and the semiconductor memory device 100 may be integrated into a single semiconductor device. In an embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC universal flash storage (UFS), and the like.

The controller 1100 and the semiconductor memory device 100 may be integrated into a single semiconductor device to form a solid state drive (SSD). The SSD includes a storage device formed to store data in a semiconductor memory. When the memory system 1000 used as the SSD, an operation speed of the host Host coupled to the memory system 2000 may be phenomenally improved.

In another embodiment, the memory system 1000 may be o provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an exemplary embodiment, the semiconductor memory device 100 or the memory system 1000 may be embedded in various packages. For example, the semiconductor memory device 100 or the memory system 2000 may be packaged in a package such as Package on Package (PoP), Ball grid arrays (BGAs), Chip scale packages (CSPs), Plastic Leaded Chip Carrier (PLCO), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 9:
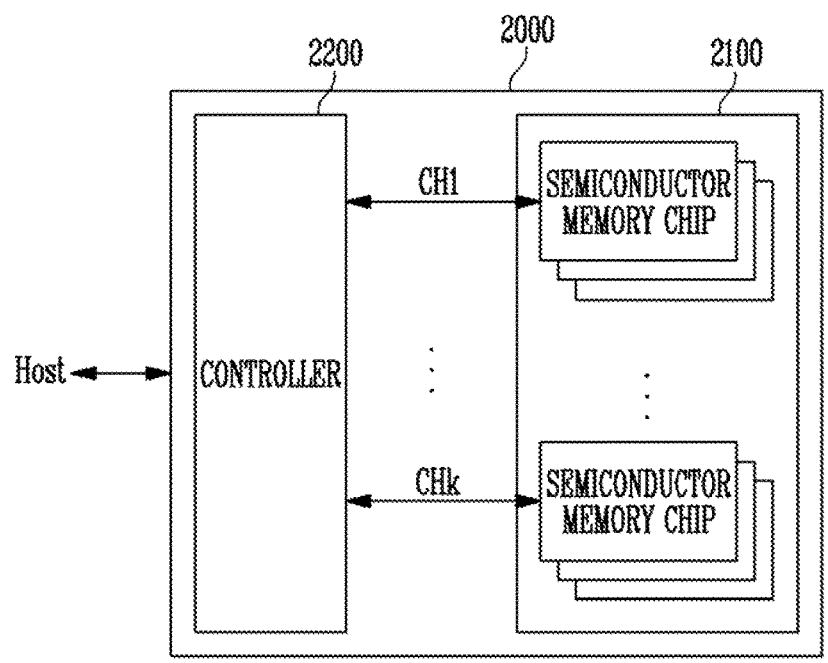
FIG. 9 is a block diagram showing an application example of the memory system of FIG. 8, according to an embodiment of the present disclosure.

FIG. 9 is a block diagram showing an application example of the memory system of FIG. 8, according to an embodiment of the present invention.

Referring to FIG. 9, the memory system 2000 includes a semiconductor memory device 2100 and a controller 2200. The semiconductor memory device 2100 includes a plurality of semiconductor memory chips 2110 which are arranged into a plurality of groups GR1 to GRn.

In FIG. 9, it is illustrated that the respective groups communicate with the controller 2200 through first to k-th channels CH1 to CHk. Each semiconductor memory chip 2110 may have the same configuration and operation as those of an embodiment of the semiconductor memory device 100 described with reference to FIG. 1.

Each group is configured to communicate with the controller 2200 through one common channel. The controller 2200 has the same configuration as that of the controller 1100 described with reference to FIG. 8 and is configured to control a plurality of memory chips of the semiconductor memory device 2100 through the plurality of channels CH1 to CHk.

Figure 10:
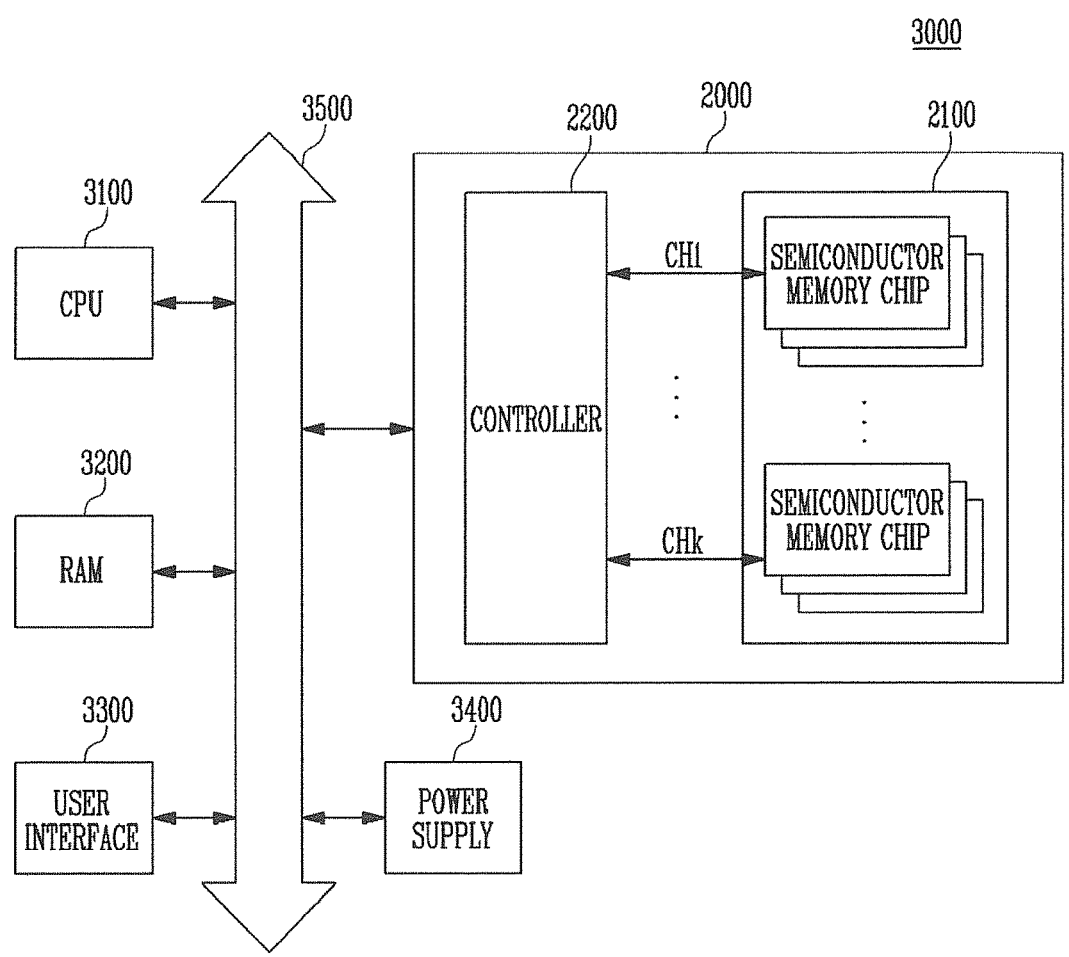
FIG. 10 is a block diagram showing computing system including the memory system illustrated with reference to FIG. 9, according to an embodiment of the present disclosure.

FIG. 10 is a block diagram showing a computing system including the memory system illustrated with reference to FIG. 9.

Referring to FIG. 10, the computing system 3000 includes a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 10, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 10, the memory system 2000 described with reference to FIG. 9 is illustrated as being used. However, the memory system 2000 may be replaced with the memory system 1000 described with reference to FIG. 8. In an embodiment, the computing system 3000 may include all of the memory systems 1000 and 2000 described with reference to FIGS. 8 and 9.

According to the present disclosure the number of signals that are outputted from a control logic during an operation of a semiconductor memory device is reduced, whereby the semiconductor memory device may be easily designed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device comprising:
   a memory cell array including a plurality of memory cells;
   a voltage generation circuit configured to generate a plurality of operating voltages;
   a decoder circuit configured to transmit the plurality of operating voltages to the memory cell array in response to a serial data signal that is sequentially inputted; and
   a control logic configured to generate the data signal, parallel internal address signals and an internal clock signal in response to a command.

2. The semiconductor memory device according to claim 1,, wherein the control logic is configured to generate parallel N-bit encoding signals in response to the command, convert the N-bit encoding signals into the data signal, and generate the internal address signals and the internal clock signal herein N is a natural number.

3. The semiconductor memory device according to claim 2, wherein the total number of bits of the data signal, the internal address signals and the internal clock signal is less than "N".

4. The semiconductor memory device according to claim, wherein the control logic comprises:
   a microcontroller configured to selectively output a plurality of operation phase codes according to sub-operations forming the operation in response to the command;
   an encoding signal generation circuit configured to generate parallel N-bit encoding signals in response to the plurality of operation phase codes; and
   a sequential output circuit configured to convert the N-bit encoding signals into the data signal.

5. The semiconductor memory device according to claim 4, wherein the microcontroller is configured to output a reset signal in an initial operation phase among the operation phases, and generate a synchronization signal'that toggles in the other phases among the operation phases.

6. The semiconductor memory device according to claim 5, wherein the decoder circuit comprises:
   a prefetch register configured to convert the data signal into parallel internal data signals according to the internal address signals;
   an output register configured to restore the N-bit encoding signals from the internal data signals in response to the synchronization signal;
   a global word line decoder configured to decode the restored N-bit encoding signals into M-bit decoding signals; and
   a switching circuit configured to switch the operating voltages to global word line groups in response to the M-bit decoding signals.

7. The semiconductor memory device according to claim 6, wherein the prefetch register comprises:
   a dock signal generation circuit configured to generate an "N" number of clock signals according to the internal address signals and the internal clock signal; and
   a register circuit configured to converts the data signal into the internal data signals in response to the "N" number of clock signals.

8. The semiconductor memory device according to claim wherein the register circuit comprises an "N" number of registers, and
wherein each of the "N" number of registers is configured to output corresponding one of the internal data signals in response to corresponding one among the "N" number of clock signals.

9. The semiconductor memory device according to claim 6, wherein the prefetch register is configured to store in advance the data signal corresponding to a next operation phase during a current operation phase among the operation phases.

10. The semiconductor memory device according to claim 6,
wherein the output register comprises an "N" number of registers, and
wherein the "N" number of registers transfers the internal data signals as the restored N-bit encoding signals, respectively, from the prefetch register to the global word line decoder.

11. A semiconductor memory device comprising:
a control logic configured to generate parallel N-bit (N is a natural number) encoding signals according to an operation phase code, and to convert the N-bit encoding signals into a serial 1-bit data signal that is serially outputted; and
a decoder circuit configured to restore the N-bit encoding signals from the 1-bit data signal, and then switch a plurality of operating voltages according to the restored N-bit encoding signals.

12. The semiconductor memory device according to claim 11, wherein the control logic further generates parallel internal address signals and an internal clock signal for the data signal.

13. The semiconductor memory device according to claim 12, wherein the total number of bits of the data signal, the internal address signals and the internal clock signal is less than "N".

14. The semiconductor memory device according to claim 12, wherein the control logic comprises:
a microcontroller configured to selectively output the operation phase code in response to a command;
an encoding signal generation circuit configured to generate the N-bit encoding signals in response to the operation phase code; and
a sequential output circuit, configured to convert the N-bit encoding signals into the data signal, and generate the internal address signals and the internal clock signal.

15. The semiconductor memory device according to claim 14, wherein the microcontroller is configured to output a reset signal in an initial operation phase among operation phases, and generate a synchronization signal that toggles in the other phases among the operation phases.

16. The semiconductor memory device according to claim 15, wherein the decoder circuit comprises:
a prefetch register configured to convert the data signal into parallel internal data signals according to the internal address signals;
an output register configured to restore the N-bit encoding signals from the internal data signals in response to the synchronization signal;
a global word line decoder configured to decode the restored N-bit encoding signals into M-bit decoding signals; and
a switching circuit configured to switch the operating voltages to global word line groups in response to the M-bit decoding signals.

17. The semiconductor memory device according to claim 16, wherein the prefetch register comprises:
a clock signal generation circuit configured to generate an "N" number of dock signals according to the internal address signals and the internal clock signal; and
a register circuit configured to converts the data signal into the internal data signal in response to the "N" number of clock signals.

18. The semiconductor memory device according to claim 16,
wherein the output register comprises an "N" number of registers, and
wherein the "N" number of registers transfers the internal data signals as the restored N-bit encoding signals, respectively, from the prefetch register to the global word line decoder.

19. A semiconductor memory device comprising:
a memory cell array;
a voltage generation circuit configured to generate a plurality of operating voltages;
a control logic configured to generate parallel N-bit encoding signals and parallel-to-serial convert the N-bit encoding signals into a serial 1-bit data signal toggling N times to represent the N-bit encoding signals; and
a decoder circuit configured to transfer one or more of the operating voltages to the memory cell ay in response to the 1-bit data signal.

20. The semiconductor memory device of claim 19,
wherein the control logic further generates multi-bit internal address signals and a 1-bit internal clock signal, and
wherein the decoder restores the N-bit encoding signals from the 1-bit data according to the multi-bit internal address signals and the 1-bit internal clock signal, decodes the restored N-bit encoding signals into M-bit decoding signals, and transfer the operating voltages to the memory cell array according to the M-bit decoding signals.

* * * * *